US010256286B2

(12) United States Patent
Duevel et al.

(10) Patent No.: US 10,256,286 B2
(45) Date of Patent: Apr. 9, 2019

(54) INTEGRATED INDUCTOR FOR INTEGRATED CIRCUIT DEVICES

(71) Applicant: INTEL CORPORATION, Santa Clara, CA (US)

(72) Inventors: Andreas Duevel, Almstedt (DE); Telesphor Kamgaing, Chandler, AZ (US); Valluri R. Rao, Saratoga, CA (US); Uwe Zillmann, Braunschweig (DE)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/589,981

(22) Filed: May 8, 2017

(65) Prior Publication Data

US 2017/0309700 A1 Oct. 26, 2017

Related U.S. Application Data

(60) Division of application No. 13/976,439, filed as application No. PCT/US2011/067980 on Dec. 29, (Continued)

(51) Int. Cl.
*H01F 5/00* (2006.01)
*H01F 27/06* (2006.01)
(Continued)

(52) U.S. Cl.
CPC .......... *H01L 28/10* (2013.01); *H01F 17/0006* (2013.01); *H01L 21/76898* (2013.01);
(Continued)

(58) Field of Classification Search
CPC ........... H01L 21/76898; H01L 23/5227; H01L 28/10; H01L 21/768; H01L 23/49827;
(Continued)

(56) References Cited

U.S. PATENT DOCUMENTS 6,031,445 A * 2/2000 Marty ................. H01F 27/2804
257/E21.022
7,209,026 B2 4/2007 Frutschy et al.
(Continued)

FOREIGN PATENT DOCUMENTS

EP 0725407 8/1996
EP 0725407 A1 * 8/1996 ......... H01F 17/0033
(Continued)

OTHER PUBLICATIONS

Pdf of EP_725407_A1.*
(Continued)

*Primary Examiner* — Brian Turner
(74) *Attorney, Agent, or Firm* — Konrad Raynes Davda & Victor LLP

(57) ABSTRACT

A three-dimensional inductor is formed in an integrated circuit die using conductive through-body-vias which pass through the body of the die and contact one or more metal interconnect layers on the front side of the die and terminate on the back side of the die. In another embodiment, the through-body-vias may pass through a dielectric material disposed in a plug in the body of the die. In yet another aspect, a transformer may be formed by coupling multiple inductors formed using through-body-vias. In still another aspect, a three-dimensional inductor may include conductors formed of stacks of on chip metallization layers and conductive through-layer-vias disposed in insulation layers between metallization layers. Other embodiments are described.

10 Claims, 11 Drawing Sheets

Related U.S. Application Data 2011, now Pat. No. 9,673,268, application No. 15/589,981, which is a division of application No. 15/169,665, filed on May 31, 2016, now Pat. No. 9,881,990, which is a continuation of application No. 13/976,439, filed as application No. PCT/US2011/067980.

(51) Int. Cl.

| | | |
|---|---|---|
| G09G 5/00 | (2006.01) | |
| H01L 49/02 | (2006.01) | |
| H01F 7/06 | (2006.01) | |
| H01L 23/48 | (2006.01) | |
| H01L 23/522 | (2006.01) | |
| H01F 17/00 | (2006.01) | |
| H01L 21/768 | (2006.01) | |
| H01L 27/06 | (2006.01) | |
| H01L 27/08 | (2006.01) | |

(52) U.S. Cl.
CPC ........ *H01L 23/481* (2013.01); *H01L 23/5227* (2013.01); *H01L 27/0688* (2013.01); *H01F 2017/002* (2013.01); *H01L 27/08* (2013.01); *H01L 2224/4813* (2013.01)

(58) Field of Classification Search
CPC ........... H01L 23/49816; H01L 23/5389; H01L 25/0652; H01L 25/0657; H01L 25/50; H01L 25/16
See application file for complete search history.

(56) References Cited

U.S. PATENT DOCUMENTS

| | | | |
|---|---|---|---|
| 7,948,346 | B2 | 5/2011 | Hebert et al. |
| 8,339,233 | B2 | 12/2012 | Tsai et al. |
| 9,229,466 | B2 | 1/2016 | Saraswat et al. |
| 2002/0057173 | A1 | 5/2002 | Johnson |
| 2002/0095770 | A1 | 7/2002 | Ahn et al. |
| 2002/0105406 | A1 | 8/2002 | Liu et al. |
| 2003/0137385 | A1 | 7/2003 | Ahn et al. |
| 2004/0196132 | A1 | 10/2004 | Yu et al. |
| 2004/0222773 | A1 | 11/2004 | Gardner et al. |
| 2006/0145805 | A1 | 7/2006 | Kim et al. |
| 2006/0148106 | A1 | 7/2006 | Ding et al. |
| 2006/0255408 | A1* | 11/2006 | Shizuno ............... H01L 21/84 257/347 |
| 2006/0267216 | A1* | 11/2006 | Li ....................... H01F 17/0033 257/778 |
| 2007/0085648 | A1 | 4/2007 | Lee et al. |
| 2008/0143468 | A1 | 6/2008 | Yokoyama et al. |
| 2008/0252407 | A1 | 10/2008 | Anderson |
| 2008/0309442 | A1 | 12/2008 | Hebert |
| 2009/0090995 | A1 | 4/2009 | Yang et al. |
| 2009/0134964 | A1 | 5/2009 | Hebert et al. |
| 2010/0136781 | A1 | 6/2010 | Kulkarni et al. |
| 2010/0140749 | A1 | 6/2010 | Kuo |
| 2010/0142119 | A1 | 6/2010 | Ryu |
| 2010/0193905 | A1 | 8/2010 | Kim et al. |
| 2010/0207594 | A1 | 8/2010 | Davoudi et al. |
| 2011/0084765 | A1 | 4/2011 | Kim et al. |
| 2011/0095395 | A1* | 4/2011 | Ellul ................. H01L 21/76898 257/531 |
| 2011/0131798 | A1 | 6/2011 | Papavasiliou et al. |
| 2011/0133879 | A1 | 6/2011 | Chiu et al. |
| 2011/0260819 | A1 | 10/2011 | Yeh et al. |
| 2012/0074582 | A1* | 3/2012 | Yu ..................... H01L 21/486 257/774 |
| 2012/0287544 | A1 | 11/2012 | Huang |
| 2013/0020675 | A1 | 1/2013 | Kireev et al. |
| 2013/0027127 | A1 | 1/2013 | Topaloglu |
| 2013/0056847 | A1 | 3/2013 | Chen |
| 2013/0094157 | A1 | 4/2013 | Giuliano |
| 2014/0027880 | A1 | 1/2014 | Duevel et al. |
| 2014/0217546 | A1 | 8/2014 | Yen et al. |
| 2016/0276424 | A1 | 9/2016 | Duevel et al. |

FOREIGN PATENT DOCUMENTS

| | | |
|---|---|---|
| KR | 20070048260 | 5/2007 |
| KR | 20110079815 | 7/2011 |

OTHER PUBLICATIONS

Wikipedia, "Integrated Circuit", [online], last modified Nov. 16, 2011, [Retrieved on Nov. 20, 2011], Retrieved from the Internet at <URL: http://en.wikipedia.org/wiki/Integrated_circuit>, (w/ image of CMOS Chip), 9 pp.
Restriction Requirement 1 for U.S. Appl. No. 13/976,439, dated Jul. 30, 2014, 8 pp.
Response to Restriction Requirement 1 for U.S. Appl. No. 13/976,439, dated Sep. 30, 2014, 13 pp.
Office Action 1 for U.S. Appl. No. 13/976,439, dated Oct. 20, 2014, 20 pp.
Response to Office Action 1 for U.S. Appl. No. 13/976,439, dated Jan. 20, 2015, 14 pp.
Office Action 2 for U.S. Appl. No. 13/976,439, dated May 5, 2015, 24 pp.
Response to Office Action 2 for U.S. Appl. No. 13/976,439, dated Aug. 5, 2015, 14 pp.
Final Office Action 1 for U.S. Appl. No. 13/976,439, dated Sep. 17, 2015, 20 pp.
Response to Final Office Action 1 for U.S. Appl. No. 13/976,439, dated Nov. 17, 2015, 15 pp.
Advisory Action for U.S. Appl. No. 13/976,439, dated Dec. 9, 2015, 20 pp.
Second Response to Final Office Action 1 for U.S. Appl. No. 13/976,439, dated Dec. 17, 2015, 14 pp.
Third Response to Final Office Action 1 for U.S. Appl. No. 13/976,439, dated May 17, 2016, 7 pp.
Notice of Allowance 1 for U.S. Appl. No. 13/976,439, dated May 27, 2016, 12 pp.
Notice of Allowance 2 for U.S. Appl. No. 13/976,439, dated Sep. 28, 2016, 18 pp.
Notice of Allowance 3 for U.S. Appl. No. 13/976,439, dated Feb. 3, 2017, 16 pp.
Restriction Requirement for U.S. Appl. No. 15/169,665, dated Aug. 1, 2016, 8 pp.
Response to Restriction Requirement for U.S. Appl. No. 15/169,665, filed Oct. 3, 2016, 10 pp.
Office Action 1 for U.S. Appl. No. 15/169,665, filed Oct. 26, 2016, 30 pp.
Response to Office Action 1 for U.S. Appl. No. 15/169,665, dated Feb. 27, 2017, 15 pp.
International Search Report and Written Opinion for International Application No. PCT/US2011/067980, dated Sep. 3, 2012, 9 pp.
International Preliminary Report on Patentability (IPRP) for International Application No. PCT/US2011/067980, dated Jul. 10, 2014, 6 pp.
Office Action 1 and Search Report for TW Application No. 101145635, dated Jun. 25, 2014, 11 pp. (w/ English Translation).
Response to Office Action 1 for TW Application No. TW101145635, dated Sep. 29, 2014, 29 pp. (w/ English version of Spec and Claims).
Office Action 2 for TW Application No. TW101145635, dated Apr. 9, 2015, 4 pp. (w/ English Translation).
Notice of Allowance for TW Application No. 101145635, dated Jul. 27, 2015, 10 pp. (w/ English Translation of Claims).
Office Action 1 for U.S. Appl. No. 13/977,460, dated Apr. 14, 2015, 13 pp.
Response to Office Action 1 for U.S. Appl. No. 13/977,460, dated Aug. 14, 2015, 9 pp.
International Search Report and Written Opinion for International Application No. PCT/US2011/068285, dated Sep. 28, 2012, 7 pp.

(56) References Cited

OTHER PUBLICATIONS

Notice of Allowance 1 for U.S. Appl. No. 15/169,665, dated Aug. 14, 2017, 8 pp.
Notice of Allowance 2 for U.S. Appl. No. 15/169,665, dated Sep. 26, 2017, 14 pp.

* cited by examiner

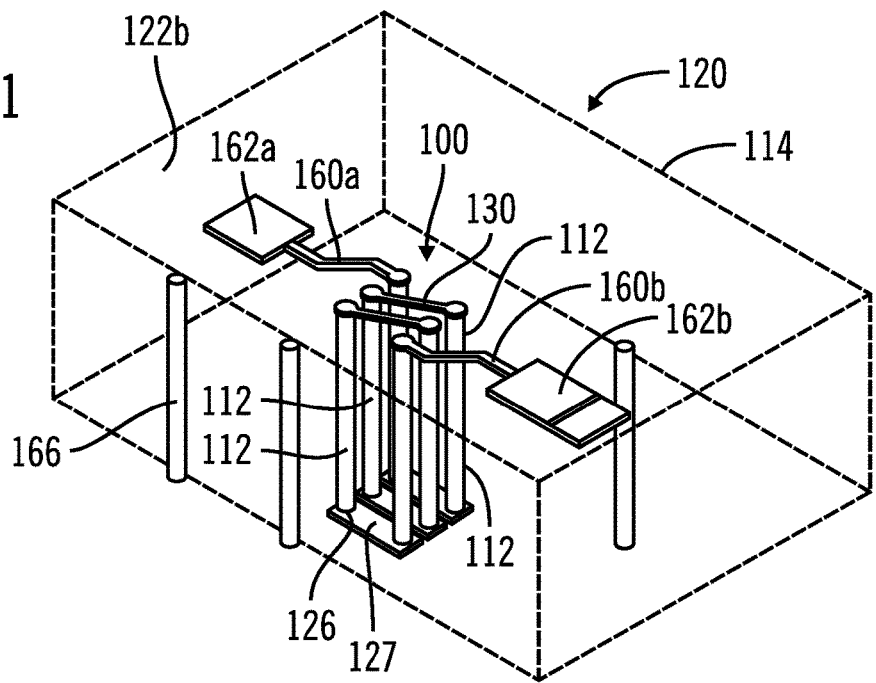
FIG. 1
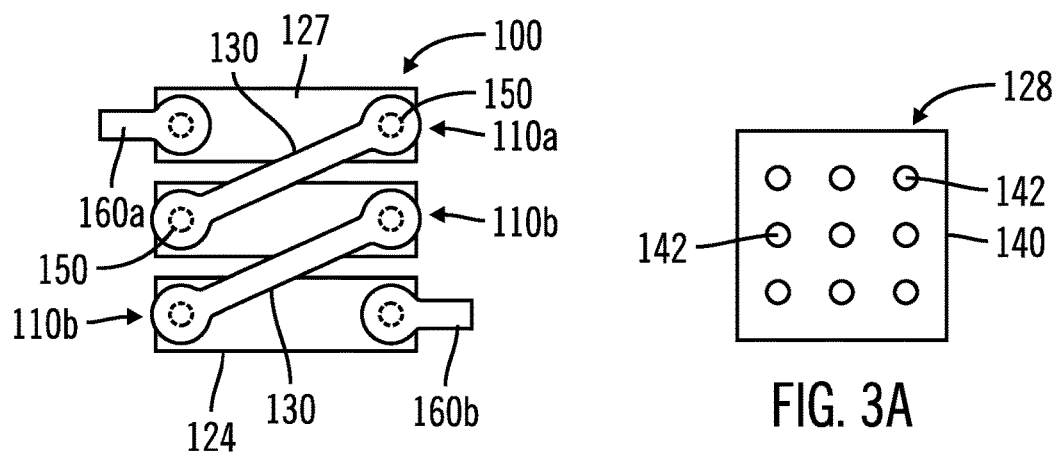
FIG. 2
FIG. 3A

INTEGRATED INDUCTOR FOR INTEGRATED CIRCUIT DEVICES

BACKGROUND

Integrated circuits typically include various active and passive circuit elements which have been integrated into a piece of semiconductor material, often referred to as a die. The die may, in turn, be fully or partially encapsulated into a package, which often includes a ceramic or plastic substrate although other materials may be used. The package mechanically supports and protects the die which is often relatively fragile.

These packages are usually attached to a printed circuit board through their second level interconnects, which often are pins, balls or other connectors arranged along the exterior of the package. The package may be attached directly to the printed circuit board, often by soldering or other connection techniques. In some applications, the package may not connect directly to the printed circuit board. Instead, an interposer or socket or other device may provide an intermediate connection between the package and the printed circuit board.

Conductors of the package typically provide separate electrical connection terminals between the printed circuit board (or interposer or socket), and the various inputs and outputs of the integrated circuit or circuits within the package. An integrated circuit die often has electrical connectors such as solder bumps to mechanically and electrically connect the integrated circuit die to the package substrate. In this manner, an electronic system can be formed by connecting various integrated circuit packages to a printed circuit board. In this regard the packaged can be viewed as a space transformer, transforming the very fine pitches on the order of 10s of microns on the silicon die side to 100s of microns on the printed circuit board side.

Inductors are used in numerous microelectronic applications, such as high frequency circuits, low-noise and power amplifiers, mixers, voltage-controlled-oscillators (VCO), power transfer and noise matching networks, circuits for reducing electromagnetic interference (EMI), power converters (including direct-current to direct-current, alternating-current to alternating-current, direct-current to alternating current, and alternating-current to direct-current converters) for the distribution of power to circuits, and clocking circuits. In addition, other applications include radio frequency (RF) circuits such as are used in a myriad of wireless devices like cellular telephones, wireless modems, and other types of communications equipment.

An inductor is a conductor which is shaped in a manner which can store energy in a magnetic field adjacent to the conductor and/or partially inside the conductor. Various designs of inductors are known. Common shapes for inductors include planar and multilayer spirals, helixes and serpentine shapes. Thus, an inductor typically has one or more "turns" which can concentrate the flux of the magnetic field induced by current flowing through each turn of the conductor in a central area defined by the inductor turns. This central area is typically referred to as the inductor core. The inductance of the inductor may often be increased by positioning magnetically permeable materials such as iron, steel, or other ferrites within the inductor core or within other areas adjacent to the conductor and within the magnetic fields so that the inductor and the magnetically permeable material are magnetically coupled to each other. The inductance may also be increased by increasing the number of turns of the inductor.

In some applications, discrete inductors are attached directly to a printed circuit board. In other applications, inductors have been embedded into printed circuit boards or integrated into or onto the semiconductor substrate of an integrated circuit die. In die substrates having multiple metal interconnect layers, a turn of an inductor may be embedded into each layer. In yet other applications, inductors have been embedded into the substrate of a package supporting and protecting an integrated circuit die. In package substrates having multiple built-up layers, a turn of an inductor may be embedded into each layer.

BRIEF DESCRIPTION OF THE DRAWINGS

Referring now to the drawings in which like reference numbers represent corresponding parts throughout:

FIG. 1 schematically illustrates a die having a three-dimensional inductor having through-body-vias in accordance with one aspect of the present description;

FIG. 2 is a back side schematic view of the inductor of FIG. 1;

FIG. 3a is a schematic top view of metal layer and through-layer-vias of an on chip interconnect stack for the inductor of FIG. 1;

DETAILED DESCRIPTION OF THE ILLUSTRATED EMBODIMENTS

An integrated circuit typically has many metal interconnect layers all of them being interconnected with vias of nanometer dimensions. Advanced integrated circuits can have in excess of 10 levels of interconnect metal layers. These are typically referred to as M1, M2, . . . M10, etc. where M1 is metal layer closest to the transistors while M10 (or higher) is the metal layer closest to the package. In one aspect of the present description, and as explained in greater detail below, a three-dimensional inductor is formed in an integrated circuit die using conductive through-body-vias which pass through the body of the die and contact one or more of the metal interconnect layers M1, M2 . . . on the front side of the die and terminate on the back side of the die. An example of such a through-body-via is a through-silicon-via formed in the bulk silicon of a die having a body comprised primarily of crystalline silicon. The through-silicon-via passes through the body of the die from the front side of the die to the back side of the die. A through-body-via in accordance with the present description may be formed in and passing through the bulk semiconductor material of other types of semiconductor dies.

Conductors disposed at the front side or back side of the die are positioned to electrically couple ends of the through-body-vias to form turns of the three-dimensional inductor or inductors. Additional conductors disposed at the front side or back side of the die are positioned to electrically couple turns of the inductor together. Other conductors provide input/output lines to the three-dimensional inductor.

In one embodiment, through-body-vias may be formed to pass through the semiconductor material of the body of the die. In another embodiment, a portion of the semiconductor material of the body of the die may be replaced with a plug of dielectric material such that the through-body-vias may pass through the dielectric material disposed in the plug in the body of the die rather than through semiconductor material of the die.

In yet another aspect, a transformer may be formed by coupling multiple inductors formed using through-body-vias. Thus, for example, a two-turn inductor of through-body-vias may be coupled to a second two-turn inductor of through-body-vias, to form a transformer.

In still another aspect, a three-dimensional inductor in accordance with the present description may include conductors formed of stacks of on chip metallization layers and conductive through-layer-vias disposed in insulation layers between metallization layers. Such stacks of metallization layers and through-layer-vias may be used to electrically couple through-body-vias of three-dimensional inductors to other conductors of the inductor or to portions of the integrated circuit.

Figure 3:
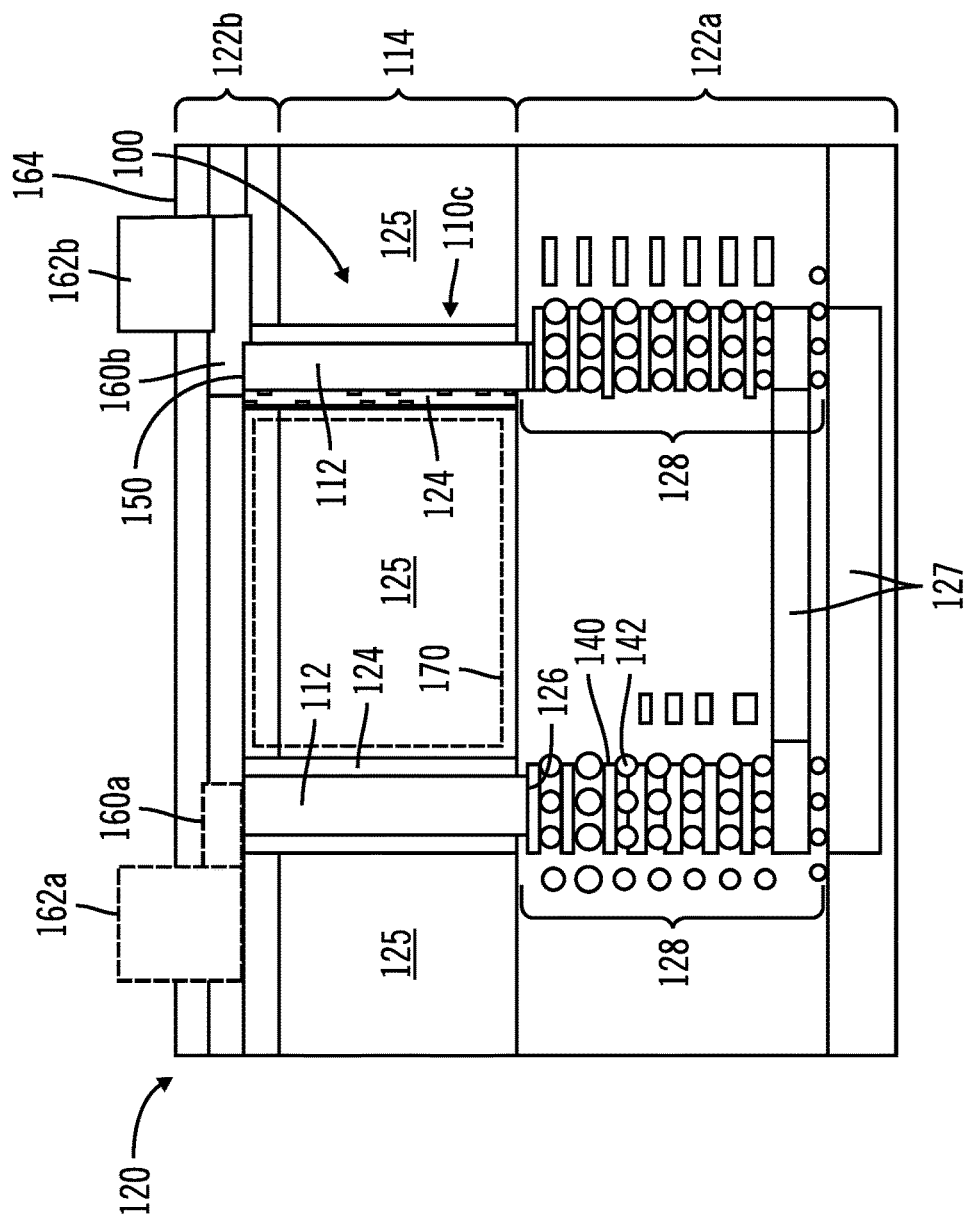
FIG. 3 is a schematic cross-sectional view of a die having a three-dimensional inductor which includes through-body-vias in accordance with one aspect of the present description.

FIGS. 1-3 illustrate an example of a three-dimensional inductor 100 in accordance with the present description. The inductor 100 includes turns 110a (FIG. 2), 110b, 110c (FIG. 3), each turn 110a, 110b, 110c having two generally vertical, parallel, conductive through-body-vias 112 which pass through the body 114 of a die 120 from the front side 122a (FIG. 3) of the die to the back side 122b of the die 120. Each through-body-via 112 is generally cylindrical (three-dimensional) in shape and is formed by depositing a conductive metal in a cylindrically-shaped passageway which passes from the front side 122a of the die to the back side 122b of the die 120.

In FIGS. 1 and 2, the semiconductor material 125 (FIG. 3) of the die 120 has been omitted for clarity. As shown in FIG. 3, a barrier/liner layer 124 may be deposited of suitable barrier or liner (or both) materials, on the walls of the passageways in the body 114, and between the semiconductor material 125 of the body 114 and the conductive material of the through-body-via 112. An example of such a barrier/liner layer 124 is a dielectric layer such as silicon dioxide, for example. It is appreciated that other materials may be used, depending upon the particular application.

Each turn 110a, 110b, 110c includes a horizontal series conductor 127 formed as metallization traces on the front side 122a of the die 120, to electrically couple the two vertical through-body-vias 112 of the inductor turn in series. The front side end 126 (FIG. 3) of each through-body-via 112 is electrically connected to a series conductor 127 by a stack 128 of conductors formed in metallization and insulation layers on the front side 122a of the die. The cross-sectional view of FIG. 3 is not drawn to scale in that the metallization and insulation layers on the front side 122a of the die 120 are much thinner than the body 114 of the die 120, and are too thin to be depicted in the schematic view of FIG. 1. It is appreciated that in some applications, the stacks 128 of conductors formed in metallization and insulation layers on the front side 122a of the die, may be omitted by, for example, extending the through-body-vias 112 to extend through the metallization and insulation layers on the front side 122a of the die.

The turns 110a and 110b are electrically coupled in series by a bridge conductor 130 formed by a metallization trace on the back side 122b of the die 120. Similarly the turns 110b and 110c are electrically coupled in series by a bridge conductor 130 formed by a metallization trace on the back side 122b of the die 120.

It is appreciated that there can be more than one backside metallization layer. In one embodiment one of these layers could be a very thick layer (for example 10 microns or greater) to ensure a low resistance for the inductor winding for high Q factor while the second layer could be thinner for general interconnect purposes on the silicon backside. Thus, the bridge conductor 130 may be formed of a very thick layer which may be several times thicker and substantially lower resistance than other metallization layers on the back side to reduce the resistance of the inductor. This thick bridge metal layer could also be embedded into the silicon substrate so that it's top surface is flush with the backside of the crystalline silicon substrate. In this case an insulating barrier can be provided to surround the three embedded surfaces of the metal line to prevent direct contact between the metal line and the crystalline silicon so as not to short the metal line to the substrate.

In the illustrated embodiment, the inductor 100 has 2 and three-quarter turns and is generally rectangular helix-shaped. It is appreciated that the number the number of turns of the inductor may vary, depending upon the particular application. For example, an inductor having 1-4 turns may be suitable for very high frequency applications in the gigahertz range. Other frequency ranges and numbers of turns may be utilized as well.

It is also appreciated that the inductor 100 may take a variety of different shapes. For example, the inductor 100 may have a spiral or serpentine shape in a two-dimensional array of three-dimensional through-body-vias 112 or may have a three-dimensional array of three-dimensional through-body-vias 112, depending upon the particular application.

In the illustrated embodiment, the body 114 of the die 120 includes the bulk crystalline silicon portion of the silicon die 120, and doped semiconductor regions of integrated circuits formed on the die 120. It is appreciated however, that in some embodiments, such as in silicon interposers, for example, the die 120 may lack any active components. The front side 122a of the die 120 is supported by the front side of the body 114, and includes deposited metallization layers separated by deposited insulation layers wherein vias formed through the insulation layers are used to interconnect the metallization layer of the integrated circuits. The back side 122b of the die 120 is supported by the back side of the body 114, and similarly includes deposited metallization layers separated by deposited insulation layers wherein conductors formed in the metallization layers and through the insulation layers are used to redistribute signals to or from the integrated circuits on the die 120.

As previously mentioned, a stack 128 of conductors formed in deposited metallization and insulation layers on the front side 122a of the die, electrically couples the front side end 126 of each through-body-via 112, to a series conductor 127 of the inductor 100. In the illustrated embodiment, each stack 128 includes alternating layers of conductive metal plates 140 (FIGS. 3, 3a) and conductive metal through-layer-vias 142. Each conductive metal plate may be formed in a metallization layer. Each layer of conductive metal through-layer-vias 142 may be formed in an insulation layer separating adjacent metallization layers. The alternating layers of conductive metal plates 140 and conductive metal through-layer-vias 142 electrically connect to each other to pass current between the front side end 126 of each through-body-via 112, and a series conductor 127 of the turn of the inductor 100.

The size and number of conductive metal plates 140 or conductive metal through-layer-vias 142 in each layer of the stack 128 may depend upon the fabrication process used to define features in the metallization and insulation layers on the front side 122a of the die, and also upon the desired resistance of the stack 128. For clarity sake, FIG. 3a shows a top view of a layer of conductive metal through-layer-vias 142 arranged in a three by three array on top an underlying conductive metal plate 140. However, for a fabrication process which defines features on a nano-scale basis, the number of conductive metal plates 140 or conductive metal through-layer-vias 142 in each layer of the stack 128 may number in the hundreds, thousands or more depending upon the desired resistance and electrical current rating of the stack 128.

Each turn 110a, 110b, 110c includes a horizontal series conductor 127 formed as a metallization trace on the front side 122a of the die 120, to electrically couple the two vertical through-body-vias 112 of the inductor turn in series. The front side end 126 (FIG. 3) of each through-body-via 112 is electrically connected to a series conductor 127 by a stack 128 of conductors formed in metallization and insulation layers on the front side 122a of the die.

As best seen in FIG. 2, the back side ends 150 of a pair of through-body-via 112 of the turns 110a and 110b are electrically coupled in series by a bridge conductor 130 formed by a metallization trace on the back side 122b of the die 120. Similarly the back side ends 150 of a pair of through-body-vias 112 of turns 110b and 110c are electrically coupled in series by a bridge conductor 130 formed by a metallization trace on the back side 122b of the die 120.

Referring to FIGS. 1-2, a back side end 150 of a through-body-via 112 of the turn 110a is electrically coupled to input/output conductors 160a, 162a formed by metallization traces on the back side 122b of the die 120. Similarly, a back side end 150 of a through-body-via 112 of the turn 110c (FIG. 3) is electrically coupled to input/output conductors 160b, 162b formed by a metallization trace on the back side 122b of the die 120. The metallization traces of the input/output conductors may be formed in one or more redistribution layers on the back side 122b of the die 120. One of these layer could be made very thick (10 microns or greater) to reduce the inductor resistance and hence improve the Q-factor. This thick bridge metal layer could also be embedded into the silicon substrate so that it's top surface is flush with the backside of the crystalline silicon substrate. In this case an insulating barrier surrounding the three embedded surfaces of the metal line can prevent direct contact between the metal line and the crystalline silicon so as not to short the metal line to the substrate.

The inductor 100 may be electrically coupled to devices external to the die 120 using the input/output conductors 160a, 160b, 162a, 162b. Also, the inductor may be electrically coupled to devices such as integrated circuits on the front side 122a of the die 120. For example, an interconnect conductor 164 (FIG. 3) in the redistribution layer may be electrically coupled to an interconnect through-body-via 166 (FIG. 1) which is coupled by a stack conductor similar to the stack conductors 128 to one or more devices formed on the front side 122a of the die 120. Alternatively input/output conductors 160a, 160b, 162a, 162b may be disposed on the front side 122a and may electrically couple the inductors to integrated circuits or other components on the front side 122a of the die 120 through the on chip stacks 128.

The inductor 100 has a core 170 defined by the turns 110a, 110b, 110c such that the turns 110a, 110b, 110c may be considered to be "wound" around the core 170. In the illustrated embodiment of FIG. 3, the core 170 is formed primarily of the bulk crystalline silicon material of the body 114 positioned in the interior of the turns 110a, 110b, 110c. A small portion of the core 170 includes the dielectric material of the liner layer 124 and a small portion of the front side and backside layers. It is appreciated that in other embodiments, the core 170 may be made primarily of other materials including dielectric and ferro-magnetic materials, or may be an air core, for example.

In another aspect of the present description, multiple inductors 100 may be formed of through-body-vias 112 and inductively coupled together to form one or more transformers which transfer electrical energy from one inductor 100 inductively coupled to another inductor 100. In inductive coupling, a varying current in one inductor 100 which may be considered a primary winding, creates a varying magnetic field or flux in the core of the transformer and thus a varying magnetic field through the other inductor 100 which may be considered a secondary winding. This varying magnetic field induces a varying electromotive force (EMF), or "voltage", in the secondary winding. By appropriate selection of the ratio of turns between the primary and secondary windings, a transformer permits an alternating current (AC) voltage to be "stepped up" or "stepped down."

Figure 4:
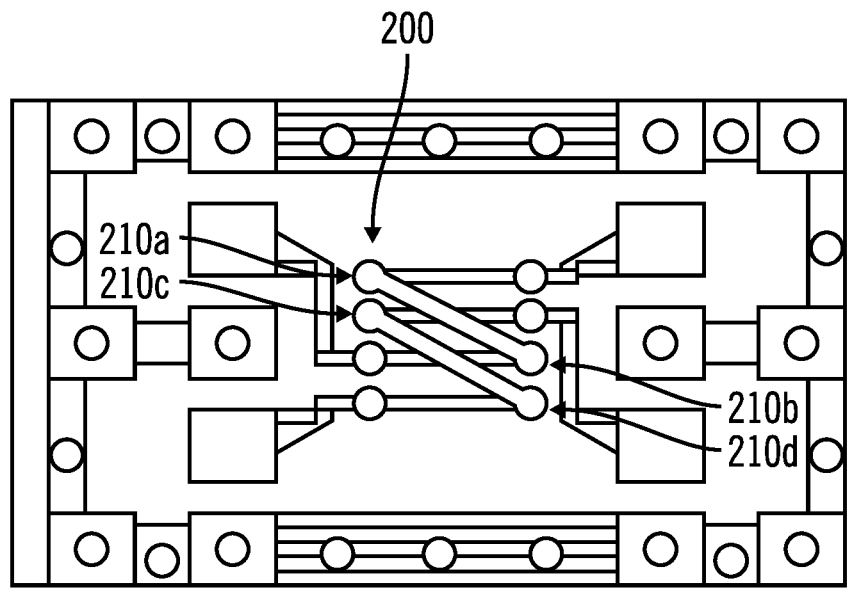
FIG. 4 is a back side view of metallization patterns of a die having a transformer which includes three-dimensional inductors having through-body-vias in accordance with one aspect of the present description.

For example, FIG. 4 shows a back side view (with semiconductor material omitted for clarity) of a 1:1 turn transformer 200 which includes a first inductor comprising turns 210a, 210b formed with through-body-vias 112, and a second inductor comprising turns 210c, 210d formed with through-body-vias 112. The turns of the inductors are interleaved and inductively coupled together in the order 210a, 210c, 21b, 210d so that a signal introduced in one inductor is induced in the other inductor of the transformer 200.

The inductively coupled inductors of the transformer 200 share a common core similar to the core 170 depicted in FIG. 3. Accordingly, the core of the inductively coupled inductors may be primarily of the bulk crystalline silicon material of the body 114 positioned in the interior of the 210a, 210c, 21b, 210d. It is appreciated that in other embodiments, the core of the inductively coupled inductors 200a, 200b may be made of other materials including dielectric or ferro-magnetic materials, or may be an air core, for example.

Figure 5:
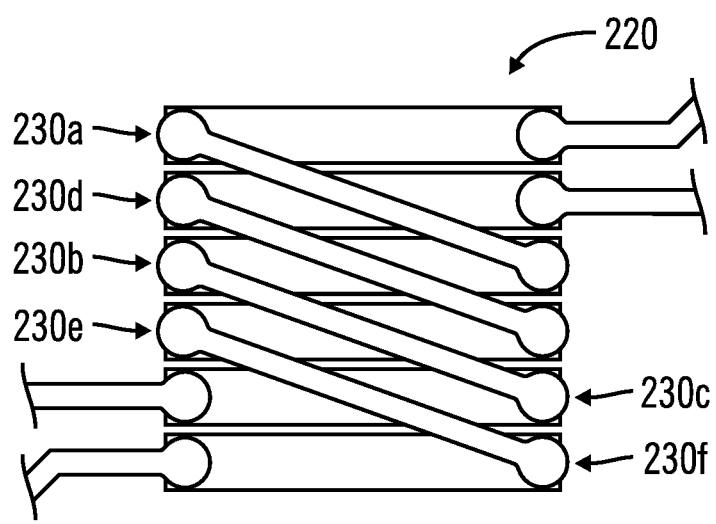
FIG. 5 is a back side view of a transformer which includes three-dimensional inductors having through-body-vias in accordance with an alternative embodiment of the present description.

FIG. 5 shows a back side view (with semiconductor material omitted for clarity) of a 2:2 turn transformer 220 which includes a first inductor comprising turns 230a, 230b, 230c formed with through-body-vias 112, and a second inductor comprising turns 230d, 230e, 230f formed with through-body-vias 112. The turns of the inductors of the transformer 220 are interleaved and inductively coupled together in the order 230a, 230d, 230b, 230e, 230c, 230f so that a signal introduced in one inductor is induced in the other inductor of the transformer 220.

Figure 6A:
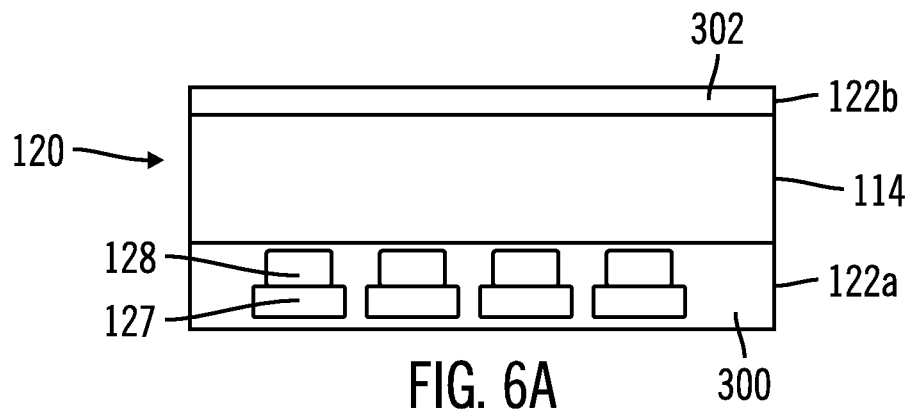
FIGS. 6a-6f depict one embodiment of operations for fabricating a three-dimensional inductor having through-body-vias in accordance with one aspect of the present description.
Figure 6B:
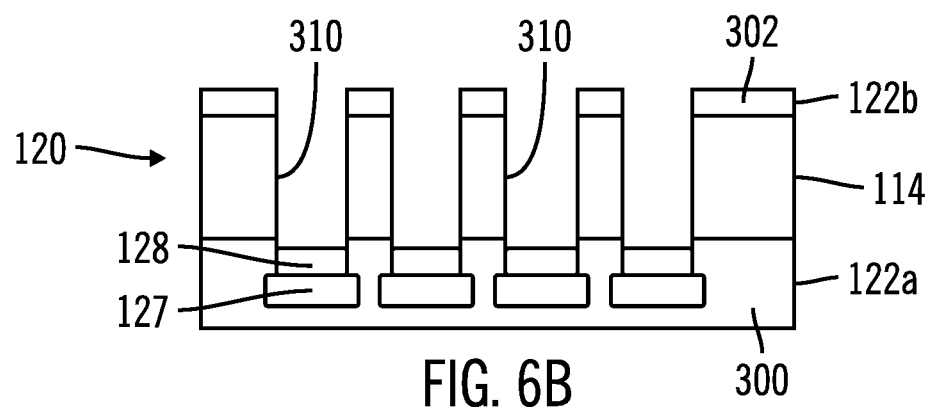

FIGS. 6a-6d illustrate operations to fabricate an inductor 100 in accordance with one embodiment of the present description. This process flow is simplified and for illustration purposes only. In this embodiment, the through body vias are formed after the front side processing of the chip is completed. A die 120 is depicted in FIG. 6a having a body 114 of bulk silicon before the through-body-vias 112 are formed. The deposited layers of the front side 122a include alternating stacks of metallization and dielectric layers 300, 128, respectively. The metal stack also includes the final layers of thick metal which form the low resistance series conductors 127 to complete the winding. The dielectric-conductor stack electrically connects with low resistance the series conductor 127 with the through-body-via 112 yet to be formed.

As shown in FIG. 6a&b, a dielectric layer 302 is deposited on the backside of the die. This layer is patterned in alignment with the on chip interconnect stacks 128 and the exposed silicon is then etched to form the holes or passageways 310 that are in alignment with the on chip interconnect stacks 128. Each hole 319 begins at the back side 122b of the die 120, passes through the backside dielectric layer 302 and through the body 114 to an on chip interconnect stack 128 at the bottom of the hole 310. The holes 310 may be formed by etching, drilling or any other suitable material removal process.

Figure 6C:
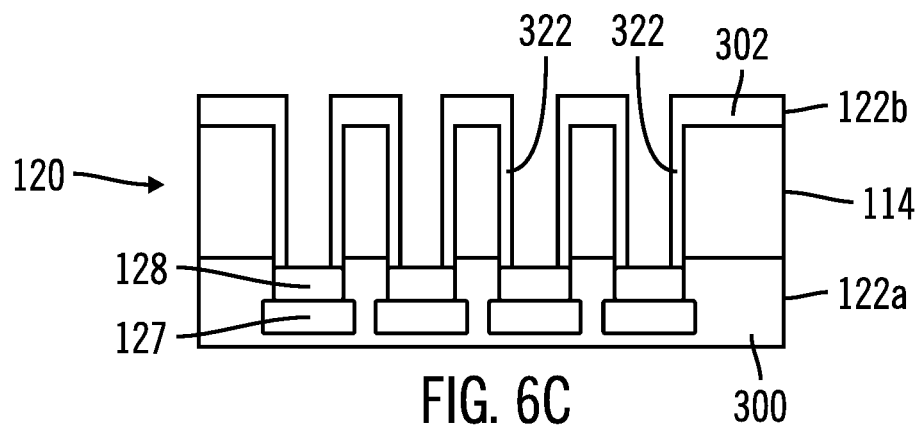

Before depositing the metal material of the through-body-vias 112, a suitable liner/barrier layer 322 may be deposited in each of the holes 310 as shown in FIG. 6c. In the illustrated embodiment, the liner layer 322 is formed of a dielectric material such as silicon dioxide to insulate the conductors of the through-body-vias 112 from the semiconductor material of the body 114. It is appreciated that any suitable material may be used, depending upon the particular application.

Figure 6D:
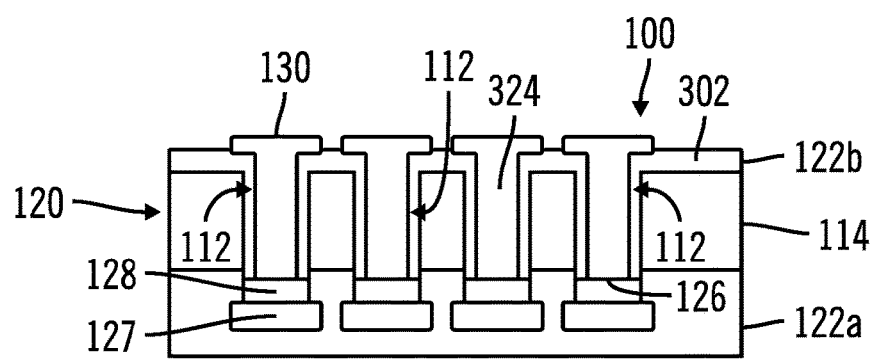
Figure 6E:
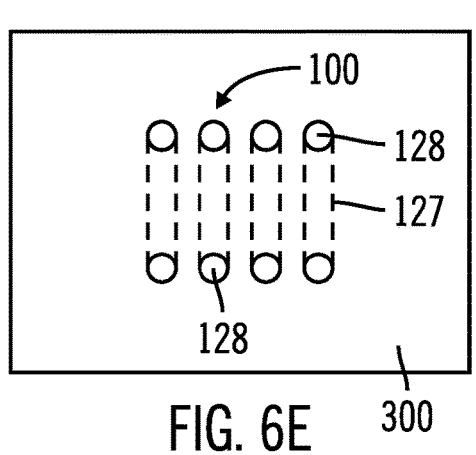
Figure 6F:
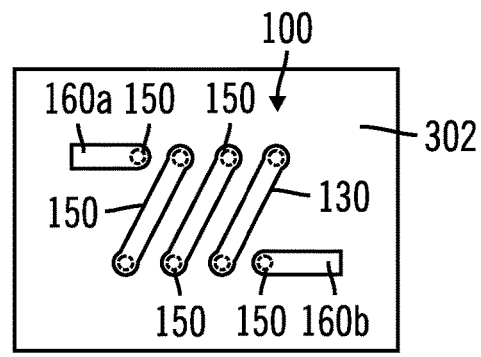

The liner layer 322 does not extend over the tops of the on chip interconnect stacks 128 leaving the tops of the on chip interconnect stacks 128 exposed. The lined holes 310 may then be filled with a suitable conductor material 324 to form the conductive through-body-vias as shown in FIG. 6d. The front side ends 126 of the through-body-vias 112 are in electrical contact with the underlying on chip interconnect stacks 128. The back side ends 150 of a pair of through-body-vias 112 of linked turns of the inductors are electrically coupled in series by a bridge conductor 130 (FIG. 6e) formed by a metallization trace in the dielectric layer 302 on the back side 122b of the die 120. Further, a back side end 150 of a through-body-via 112 of a turn may be electrically coupled to input/output conductors 160a, 160b formed by metallization traces on the back side 122b of the die 120. The on chip interconnect stacks 128 at the front side ends of each pair of through-body-vias 112 of each turn may be coupled by a series conductors 127 (FIG. 6f) formed by metallization trace in or on the dielectric layer 300 on the front side 122a of the die 120.

Figure 7:
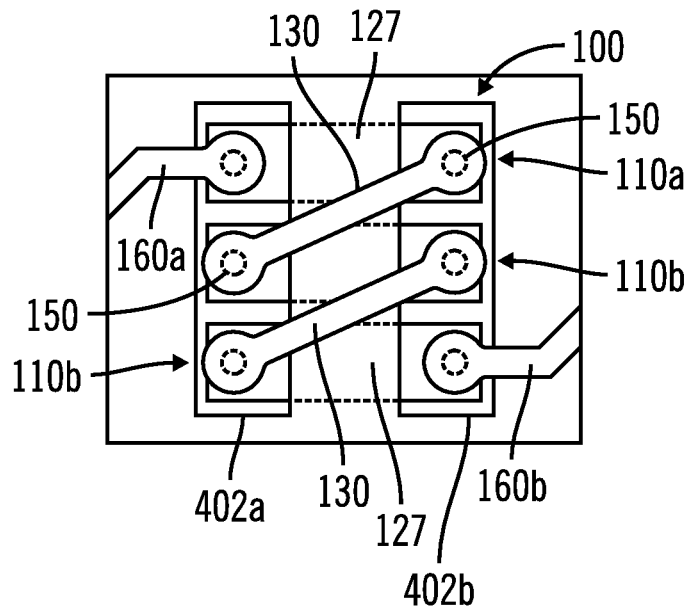
FIG. 7 is a back side schematic view of an alternative embodiment of an inductor in accordance with the present description.
Figure 8:
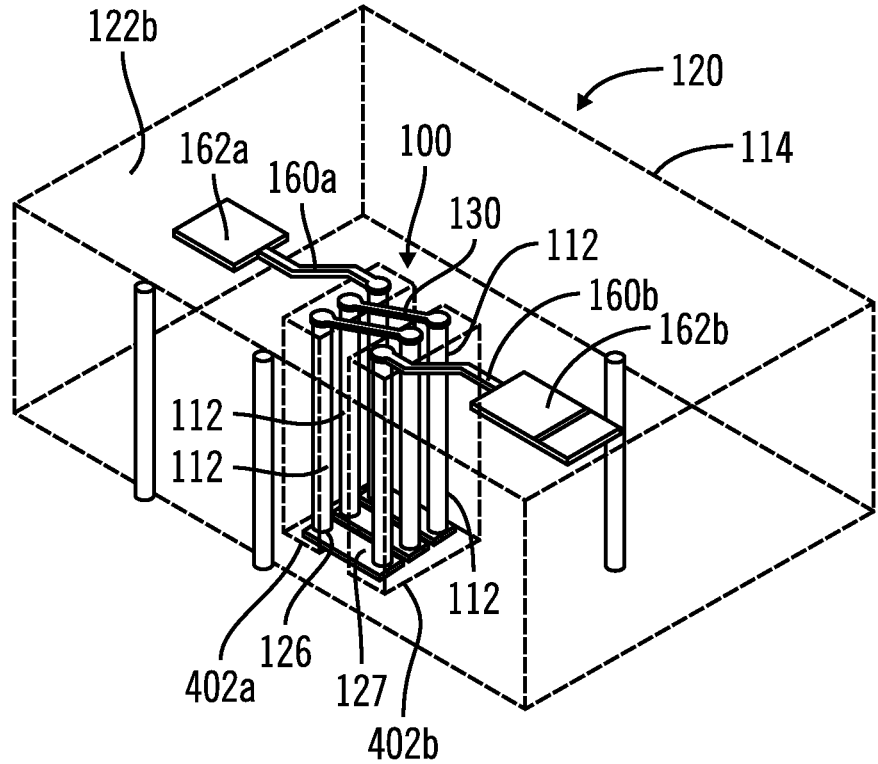
FIG. 8 is a schematic view of a die having the inductor of FIG. 7.

FIGS. 7 and 8 show an inductor 400 in accordance with an alternative embodiment in which generally rectangular portions or plugs 402a, 402b of insulator material replace semiconductor material removed from the body 114. In addition, the through-body-vias 112 (FIG. 8) are formed in the insulator plugs 402a, 402b instead of in the bulk silicon material of the body 114. In the embodiment of FIGS. 7, 8, a first row 410a of through-body-vias 112 are formed in the insulator plug 402a, and a second row 410b of through-body-vias 112 are formed in the insulator plug 402b. The insulator plugs 402a, 402b are oriented transverse to the windings or turns 110a, 110b, 110c of the inductor 400. It is believed that the electrical performance of the inductor 400 may be improved by forming the through-body-vias in insulator material rather than in bulk semiconductor material of the body 114. Furthermore, it is believed that fabrication techniques for the inductors having through-body-vias may be simplified, in some applications.

Figure 9:
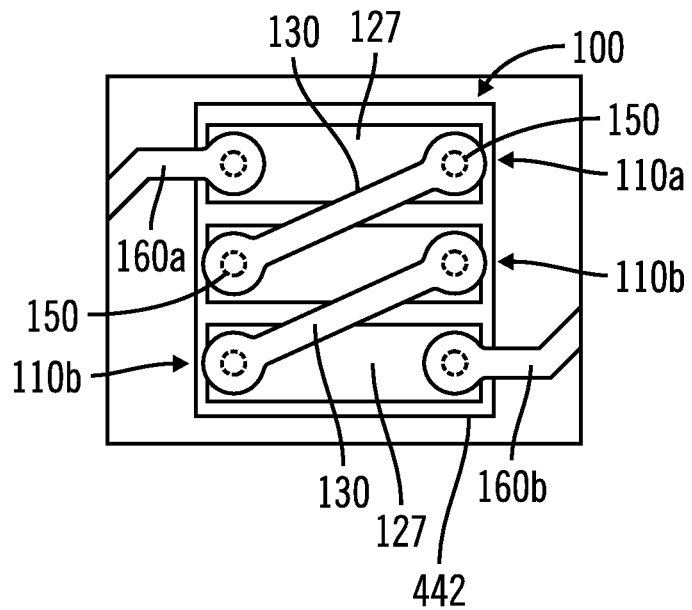
FIG. 9 is a back side schematic view of another alternative embodiment of an inductor in accordance with the present description.
Figure 10:
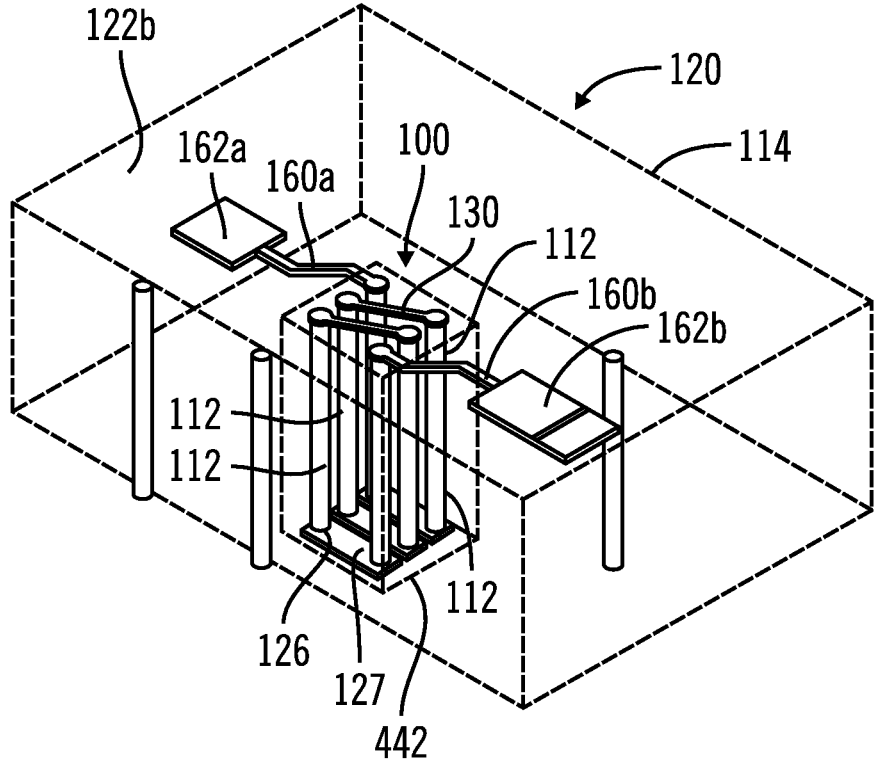
FIG. 10 is a schematic view of a die having the inductor of FIG. 9.

FIGS. 9 and 10 show an inductor 440 in accordance with an alternative embodiment in which a generally rectangular portion or plug 442 of insulator material replaces semiconductor material removed from the body 114. In this example, the single insulator plug 442 is commensurate in size with the inductor 440. For a 0.6 nH inductor, the cross-sectional area of the plug 442 could be approximately 50 by 50 microns, for example. Other sizes may be used, depending upon the particular application.

In the embodiment of FIGS. 9, 10, all of the through-body-vias 112 of the inductor 440 are formed in the insulator plug 442 instead of in the bulk silicon material of the body 114. Although the plugs 402a, 402b, 442 are depicted as being generally rectangular, it is appreciated that plugs of insulator material to replace semiconductor material within the inductor structure, may have other shapes depending upon the particular application. In addition in this embodiment, the height of the plug is assumed to be close to the thickness of the crystalline silicon substrate. However, it is appreciated that the height can be less than the substrate thickness and only a partial thickness of silicon is removed. This may be dictated by manufacturability details. In this case part of the magnetic flux will go through the plug and part through the crystalline silicon. The inductor Q factor for partial silicon removal will be less than for full silicon removal but will still be higher than with no silicon removal It is believed that removal of some or all of the silicon in the space occupied by the through-silicon-vias 112 of the inductors 400, 440 can mitigate eddy current losses, and a consequence, increase electrical performance of the inductors 400, 440. For example, it is believed that quality factor, self-resonance frequency (SRF), and coupling coefficient may be improved by insulator for semiconductor replacement in the vicinity of the through-silicon-vias 112.

Figure 11:
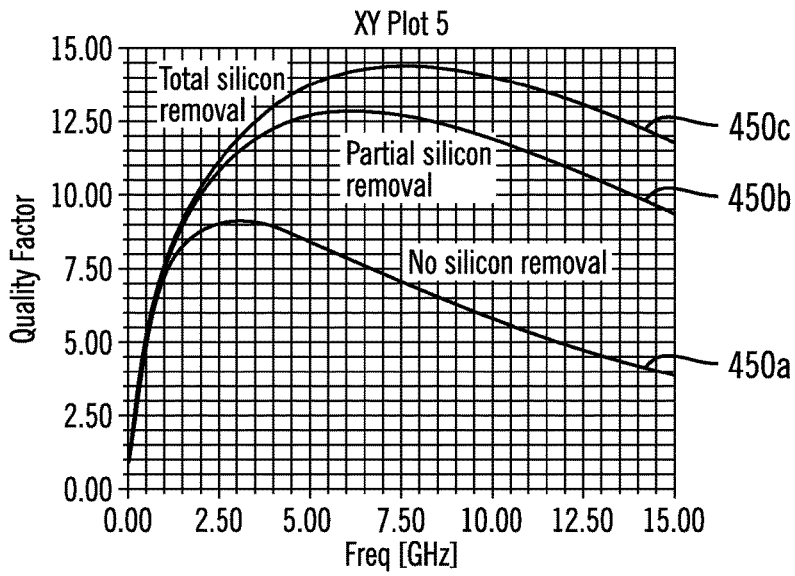
FIGS. 11 and 12 illustrate simulations of characteristics of alternative embodiments of three-dimensional inductors having through-body-vias in accordance with one aspect of the present description.
Figure 12:
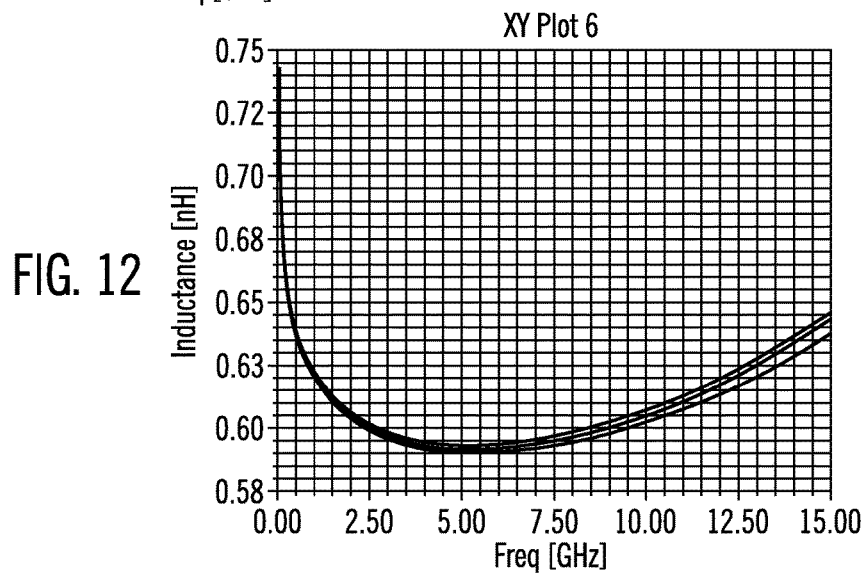

FIGS. 11 and 12 depict the results of simulations of the electromagnetic functioning of inductors such as the inductors 400, 440 in which the silicon around the through-body-vias has been fully or partially replaced with silicon dioxide, as compared to an inductor such as the inductor 100 in which the through-body-vias pass through a silicon portion of the die body rather than through an insulator plug disposed in the die body. Thus, a plot line 450a plots the simulated quality factor as a function of frequency, for an inductor similar to the inductor 100 in which the through-body-vias pass through a silicon portion of the die body rather than through an insulator plug disposed in the die body. A plot line 450b plots the simulated quality factor as a function of frequency, for an inductor similar to the inductor 400 in which the silicon around the through-body-vias has been partially replaced with a pair of silicon dioxide plugs similar to the plugs 402a, 402b. A plot line 450c plots the simulated quality factor as a function of frequency, for an inductor similar to the inductor 440 in which the silicon around the through-body-vias has been fully replaced with a large silicon dioxide plug similar to the plug 442.

In the simulations of FIGS. 11 and 12, plot line 450c shows a quality factor improvement of approximately three times for an inductor in which the silicon around the through-body-vias has been fully replaced with a large silicon dioxide plug as compared to the plot line 450a for an inductor in which the through-body-vias pass through a silicon portion of the die body. Plot line 450b shows an intermediate quality factor for an inductor in which the silicon around the through-body-vias has been partially replaced with a pair of silicon dioxide plugs. However, as shown in FIG. 12 the change in inductance value was found to be negligible in the simulations of FIG. 11. In the simulations, the achieved inductance density was 252 nH/mm$^2$ based on a 0.63 nH inductor. It is appreciated that other inductances and inductance density may be achieved in RF and other frequency ranges, depending upon the particular application.

Figure 13A:
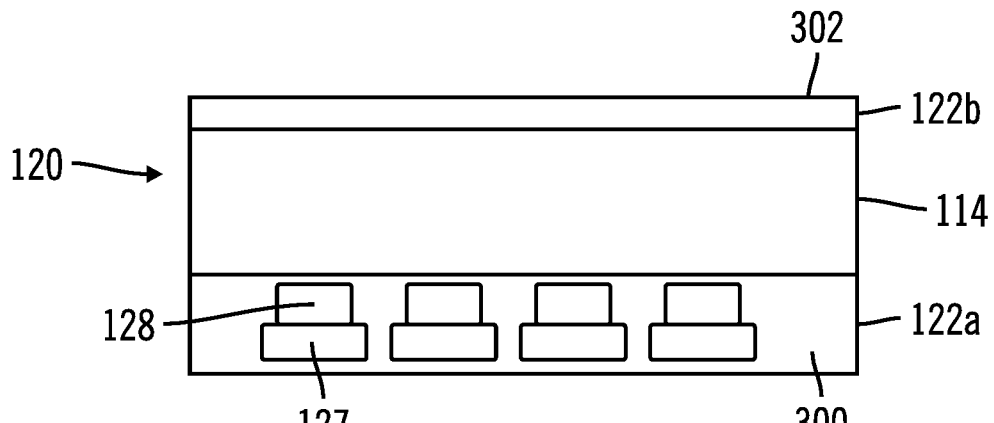
FIGS. 13a-13g depict another embodiment of operations for fabricating a three-dimensional inductor having through-body-vias in accordance with one aspect of the present description.

FIGS. 13a-13d illustrate operations to fabricate an inductor 400 in accordance with one embodiment of the present description. The process flow is simplified and for illustration purposes only. In this embodiment, the through-body vias and plugs are formed after the front side processing of the chip is completed. Similar to FIG. 6a, FIG. 13a depicts a die 120 having a body 114 of bulk silicon before the through-body-vias 112 are formed. The deposited layers of the front side 122a include alternating layers of dielectric and metal conductor stacks 300 and 128a respectively. The metal stack also includes the final layers of thick metal which form the low resistance series conductors 127 to complete the winding. The dielectric-conductor stack electrically connects with low resistance the series conductor 127 and a through-body-via 112 yet to be formed.

Figure 13B:
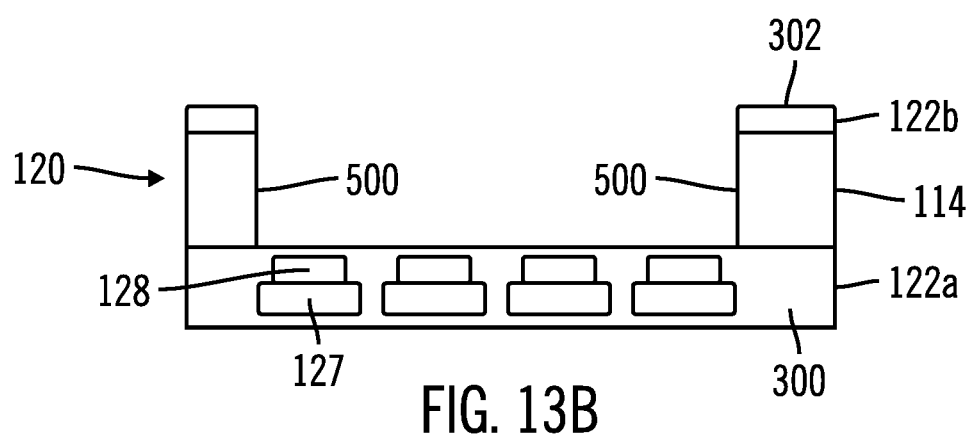
Figure 13C:
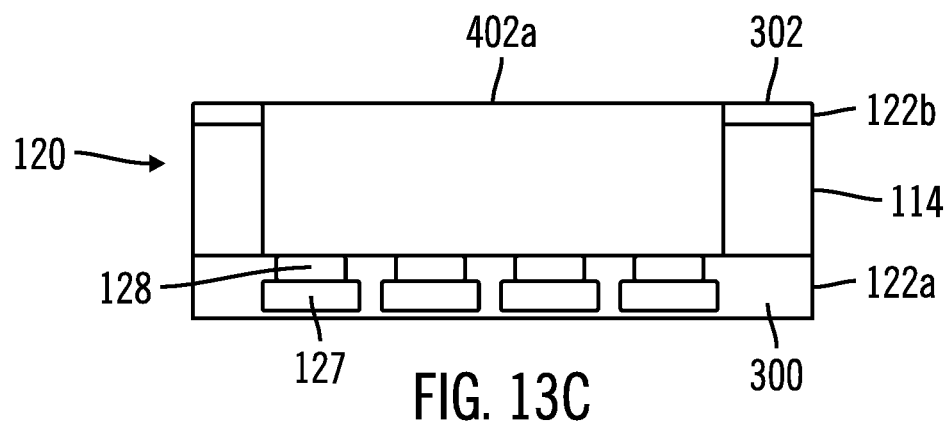
Figure 13D:
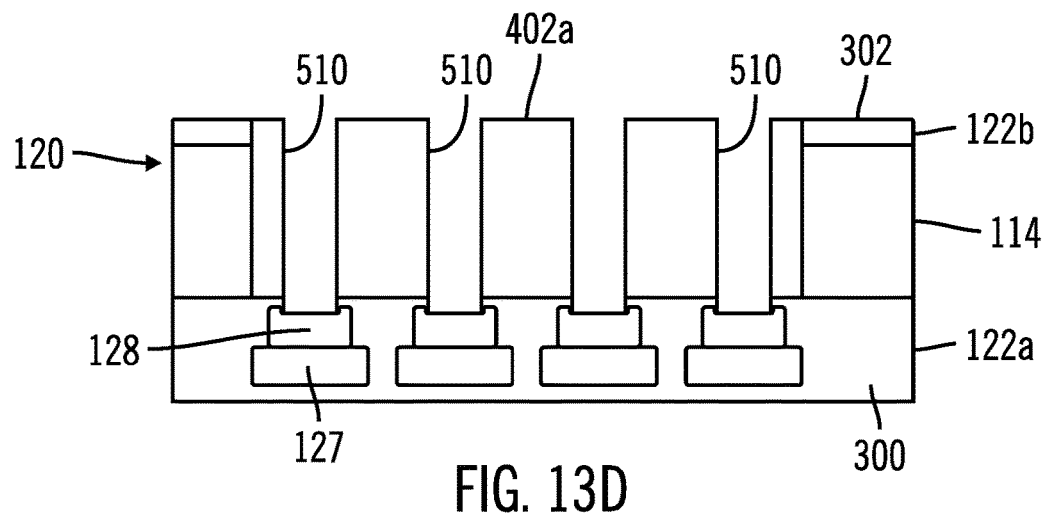

As shown in FIGS. 13a, 13b, a dielectric layer 302 is deposited on the backside of the die. This layer is patterned to exposed the silicon to be removed and this exposed silicon is etched to form a cavity 500 (FIG. 13b) in the bulk silicon of the body 114 before the through-body-vias 112 are formed. As shown this cavity extends through the full thickness of the silicon substrate. It is appreciated that the cavity depth could be less than the full thickness of the silicon substrate and this may be dictated by manufacturing details. The cavity 500 is filled (FIG. 13c) with dielectric insulator material to form a plug such as the plug 402a. The plug 402b (FIGS. 7, 8) may be formed in a similar fashion. Holes or passageways 510 are formed (FIG. 13d) in alignment with the on chip interconnect stacks 128. Each hole 510 begins at the back side 122b of the die 120, passes through the backside dielectric layer 302 and through the insulator plug 402a of the body 114 to an on chip interconnect stack 128 at the bottom of the hole 510. The holes 510 may be formed by etching, drilling or any other suitable material removal process. Because the plug 402a is made of a dielectric material, a liner or barrier layer may be omitted in some applications which can reduce fabrication costs in some applications.

Figure 13E:
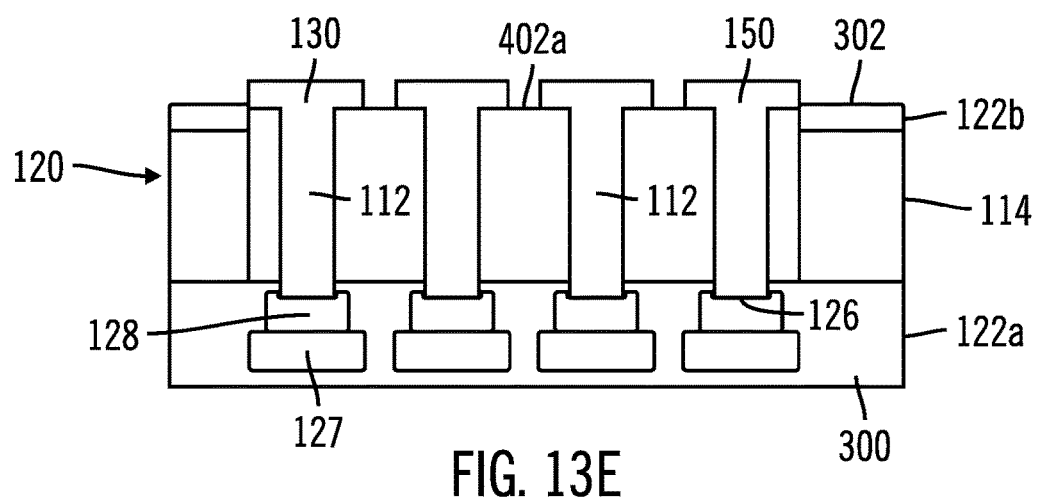
Figure 13F:
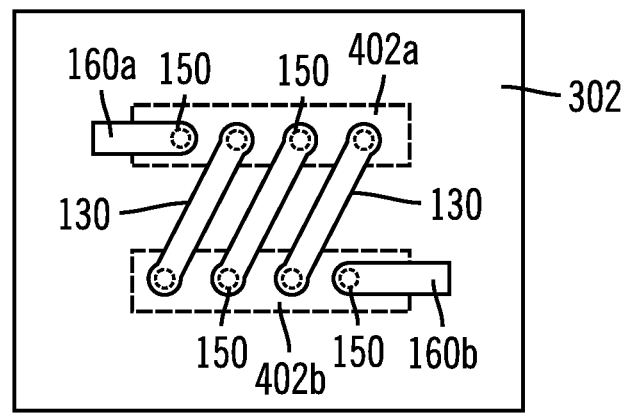
Figure 13G:
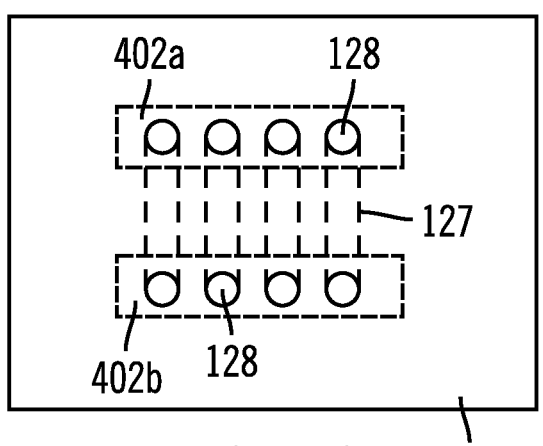

The holes 510 expose the tops of the on chip interconnect stacks 128. The holes 510 may then be filled or coated with a suitable conductor material to form the conductive through-body-vias 112 as shown in FIG. 13e. The front side ends 126 of the through-body-vias 112 are in electrical contact with the underlying on chip interconnect stacks 128. The back side ends 150 of a pair of through-body-vias 112 of linked turns of the inductors are electrically coupled in series by a bridge conductor 130 (FIG. 13f) formed by a metallization trace in the dielectric layer 302 on the back side 122b of the die 120. If there are more than one backside metal interconnect layers and the bridge conductor 130 is a thick layer that is more than several times as thick as the other layers, it could be embedded into the silicon substrate so that it's top surface is flush with the backside of the crystalline silicon substrate. In this case an insulating barrier can surround the three surfaces of the metal line to prevent contact between the metal line and the crystalline silicon so as not to short the metal line to the substrate. Further, a back side end 150 of a through-body-via 112 of a turn may be electrically coupled to input/output conductors 160a, 160b formed by metallization traces on the back side 122b of the die 120. The on chip interconnect stacks 128 at the front side ends of each pair of through-body-vias 112 of each turn may be coupled by a series conductors 127 (FIG. 13g) formed by metallization trace in or on the dielectric layer 300 on the front side 122a of the die 120.

Additional Embodiment Details

The described techniques for may be embodied as a method, apparatus, computer program product or article of manufacture using standard programming and/or engineering techniques to produce software, firmware, hardware, or any combination thereof. The outputs of on-die circuitry which may include programmable processors, dedicated processors, comparators or adder/subtractor circuits, may be processed by on-die logic circuitry, firmware or software or processed by off chip logic circuitry, firmware or software, or a combination thereof, to process optically transmitted data. The term "article of manufacture" as used herein refers to code or logic embodied in hardware logic (e.g., an integrated circuit chip, Programmable Gate Array (PGA), Application Specific Integrated Circuit (ASIC), etc.) or a computer readable medium, such as magnetic storage medium (e.g., hard disk drives, floppy disks, tape, etc.), optical storage (CD-ROMs, optical disks, etc.), volatile and non-volatile memory devices (e.g., EEPROMs, ROMs, PROMs, RAMs, DRAMs, SRAMs, firmware, programmable logic, etc.).

Code in the computer readable medium is accessed and executed by a processor. The "article of manufacture" or "computer program product" may comprise the medium in which the code is embodied. Additionally, the "article of manufacture" "computer program product" may comprise a combination of hardware and software components in which the code is embodied, processed, and executed. Of course, those skilled in the art will recognize that many modifications may be made to this configuration without departing from the scope of the present description, and that the article of manufacture may comprise any tangible information bearing medium known in the art.

In certain applications, the integrated inductors embodiments having through-body-vias, may be embodied in a computer system including a video controller to render information to display on a monitor or other display coupled to the computer system, a device driver and a network controller, such as a computer system comprising a wireless communication system, a tablet computer, smart phone, DVD or Blu-ray player, desktop, workstation, server, mainframe, laptop, handheld computer, etc. Alternatively, the integrated inductors embodiments having through-body-vias may be embodied in a computing device that does not include, for example, a video controller, such as a switch, router, etc, or does not include a network controller, for example.

The illustrated operations of FIGS. 6a-6f and 13a-13g show certain events occurring in a certain order. In alternative embodiments, certain operations may be performed in a different order, modified or removed. Moreover, operations may be added to the above described logic and still conform to the described embodiments. Further, operations described herein may occur sequentially or certain operations may be processed in parallel. Yet further, operations may be performed by a single processing unit or by distributed processing units.

Figure 14:
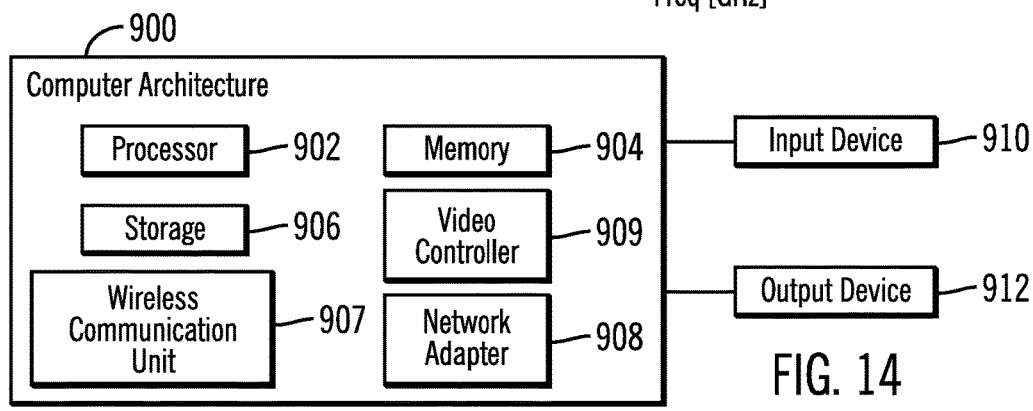
FIG. 14 illustrates an embodiment of a system incorporating a die having a three-dimensional inductor having through-body-vias in accordance with one aspect of the present description.

FIG. 14 illustrates one embodiment of a computer architecture 900 of components, any one of which may include a photonic package in accordance with the present description. The computer architecture 900 may comprise any computing device known in the art, such as a mainframe, server, personal computer, workstation, laptop, handheld computer, telephony device, media player, network appliance, virtualization device, storage controller, etc. The architecture 900 may include a processor 902 (e.g., a microprocessor), a memory 904 (e.g., a volatile memory device), and storage 906 (e.g., a non-volatile storage, such as magnetic disk drives, optical disk drives, a tape drive, etc.). The storage 906 may comprise an internal storage device or an attached or network accessible storage. Programs in the storage 906 are loaded into the memory 904 and executed by the processor 902 in a manner known in the art. In some embodiments, a wireless communication unit 907 can communicate with other wireless devices such as cellular phones, wireless voice and data networks, wireless input/output devices, etc. The architecture further includes a network controller or adapter 908 to enable communication with a network, such as an Ethernet, a Fibre Channel Arbitrated Loop, etc. Further, the architecture may, in certain embodiments, include a video controller 909 to render information on a display monitor, where the video controller 909 may be embodied on a video card or integrated on integrated circuit components mounted on the motherboard. An input device 910 is used to provide user input to the processor 902, and may include a keyboard, mouse, pen-stylus, microphone, touch sensitive display screen, or any other activation or input mechanism known in the art. An output device 912 is capable of rendering information transmitted from the processor 902, or other component, such as a display monitor, printer, storage, etc.

The network adapter 908 may embodied on a network card, such as a Peripheral Component Interconnect (PCI) card, PCI-express, or some other I/O card, or on integrated circuit components mounted on the motherboard. The storage 906 may comprise an internal storage device or an attached or network accessible storage. Programs in the storage 906 are loaded into the memory 904 and executed by the processor 902. Any one or more of the devices of the computer architecture 900 may include one or more integrated circuits having integrated inductors with through-body-vias as described herein.

The foregoing description of various embodiments has been presented for the purposes of illustration and description. It is not intended to be exhaustive or to limit to the precise form disclosed. Many modifications and variations are possible in light of the above teaching.

What is claimed is:

1. A method, comprising:
  forming first and second turns of a first through-body-via-based inductor in a die having a back side and a front side of the die, the inductor first turn forming comprising:
    forming first and second conductive through-body-vias passing through the body of the die from the front side of the die to the back side of the die, said first and second through-body-vias each having a front side end at the front side of the die and said first and second through-body-vias each having a back side end at the back side of the die;
    wherein the forming first and second through-body-vias includes:
      forming first and second through-body passageways passing through the body of the die from the front side of the die to the back side of the die; and
      depositing conductive metal in said first and second through-body passageways from the front side of the die to the back side of the die to form said first and second conductive through-body-vias; and
    wherein said forming first and second through-body passageways comprises:
      removing semiconductor material from the body of the die from the front side of the die to the back side of the die;
      replacing removed semiconductor material with insulative material to form a plug of insulative material within the body of the die; and
      removing insulative material from the plug; and
  forming a transformer including forming first and second turns of a second through-body-via-based inductor in the die; and
  interwinding the first and second turns of the first and second through-body-via-based inductors so that the first and second through-body-via-based inductors are inductively coupled together and share a core in the die body.

2. The method of claim 1 wherein the inductor first turn forming further includes:
  forming a first series conductor disposed at one of the front side and the back side of the die and electrically coupling together ends of the first and second through-body-vias.

3. The method of claim 2, wherein the forming a second turn of the first through-body-via-based inductor in the die comprises:
  forming third and fourth conductive through-body-vias passing through the body of the die from the front side of the die to the back side of the die, said third and fourth through-body-vias each having a front side end at the front side of the die and a back side end at the back side of the die; and
  forming a second series conductor disposed at one of the front side and the back side of the die and electrically coupling together of the conductive third and fourth through-body-via.

4. The method of claim 3 further comprising forming a bridge conductor disposed at one of the front side and back side of the die and electrically coupling a through-body-via of the first turn and a through-body-via of the second turn in series.

5. The method of claim 4 further comprising forming a plurality of conductive metal layers on the back side of the die which include a first conductive metal layer having a first thickness and a first resistance, and a second conductive metal layer having a second thickness at least several times thicker than the first thickness and a second resistance less than the first resistance and wherein the bridge conductor forming includes forming the bridge conductor from the second conductive metal layer.

6. The method of claim 2 further comprising forming a stack conductor on the front side of the die for each through-body-via, comprising:
   forming a stack of electrically conductive metal layers separated by insulation layers disposed at the front side of the die; and
   forming a plurality of conductive through-layer-vias in each insulation layer, each through-layer-via passing through an insulation layer and electrically coupling adjacent metal layers of the stack conductor.

7. The method of claim 1 wherein said forming first and second through-body passageways comprises removing bulk semiconductor material from the body of the die from the front side of the die to the back side of the die; and wherein the forming first and second through-body-vias further includes depositing liner material in each through-body passageway before depositing the conductive metal in the through-body passageways.

8. The method of claim 1 wherein all the through-body-vias of the inductors pass through a single plug of insulative material.

9. The method of claim 1 further comprising depositing conductive metal layers on the front side and on the back side of the die, wherein each through-body-via extends to and is in electrical contact with at least one conductive metal layer of the front side and on the back side of the die.

10. The method of claim 1 further comprising:
   forming transistor devices in diffusion regions at the at the front side of the die;
   forming an interconnection conductor in a metal layer coupled to the first inductor and disposed in a redistribution layer at the back side of the die; and
   forming an interconnection through-body via electrically coupled to the interconnection conductor and to at least one of said transistor devices on the front side of the die wherein the first inductor is electrically coupled to at least one of said transistor devices on the front side of the die.

\* \* \* \* \*